(12) United States Patent
Kwon et al.

(10) Patent No.: US 10,843,720 B2
(45) Date of Patent: Nov. 24, 2020

(54) STEERING WHEEL

(71) Applicants: HYUNDAI MOTOR COMPANY, Seoul (KR); KIA MOTORS CORPORATION, Seoul (KR)

(72) Inventors: Gideok Kwon, Seoul (KR); Donghee Seok, Suwon-Si (KR); Jong Bok Lee, Suwon-Si (KR); Heejin Ro, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 122 days.

(21) Appl. No.: 16/175,109

(22) Filed: Oct. 30, 2018

(65) Prior Publication Data

US 2019/0210629 A1  Jul. 11, 2019

(30) Foreign Application Priority Data

Jan. 5, 2018  (KR) .......................... 10-2018-0001619

(51) Int. Cl.
| | |
|---|---|
| *B62D 1/04* | (2006.01) |
| *G06F 3/044* | (2006.01) |
| *B60R 16/027* | (2006.01) |
| *B62D 1/06* | (2006.01) |
| *B62D 1/08* | (2006.01) |
| *H03K 17/96* | (2006.01) |

(52) U.S. Cl.
CPC ............ *B62D 1/046* (2013.01); *B60R 16/027* (2013.01); *B62D 1/06* (2013.01); *B62D 1/08* (2013.01); *G06F 3/044* (2013.01); *G06F 3/0443* (2019.05); *G06F 3/0448* (2019.05); *H03K 17/9622* (2013.01); *G06F 2203/04107* (2013.01); *H03K 2017/9602* (2013.01)

(58) Field of Classification Search
CPC .. B62D 1/046; B62D 1/06; B62D 1/08; G06F 3/0448; G06F 3/0443; B60R 16/027
See application file for complete search history.

(56) References Cited

U.S. PATENT DOCUMENTS

| | | | | |
|---|---|---|---|---|
| 2017/0147130 | A1* | 5/2017 | Kwon | ................... G06F 3/0412 |
| 2018/0178760 | A1* | 6/2018 | Lee | .......................... B62D 1/04 |
| 2018/0210604 | A1* | 7/2018 | Won | ...................... G06F 3/0481 |
| 2018/0348392 | A1* | 12/2018 | Nishio | ................... B62D 1/046 |
| 2018/0354543 | A1* | 12/2018 | Nishio | ............... G01R 27/2605 |
| 2019/0210630 | A1* | 7/2019 | Seok | ........................ B60K 35/00 |
| 2020/0041680 | A1* | 2/2020 | Okazaki | ................... G01V 3/08 |

* cited by examiner

*Primary Examiner* — Faye M Fleming
(74) *Attorney, Agent, or Firm* — Morgan, Lewis & Bockius LLP

(57) ABSTRACT

A steering wheel includes: a wheel frame; a base, which includes a metal composite, coupled to the wheel frame to cover the wheel frame; a sensor electrode disposed on the base; and a sensor integrated circuit (IC) electrically connected to the sensor electrode and configured to sense a change in capacitance of the sensor electrode.

14 Claims, 5 Drawing Sheets

STEERING WHEEL

CROSS-REFERENCE TO RELATED APPLICATION

This application is based on and claims priority under 35 U.S.C. § 119 to Korean Patent Application No. 10-2018-0001619, filed on Jan. 5, 2018 in the Korean Intellectual Property Office, the disclosure of which is incorporated by reference herein in its entirety.

TECHNICAL FIELD

The present disclosure relates to a steering wheel, and more particularly, to a steering wheel capable of recognizing whether or not a user is holding the steering wheel.

BACKGROUND

Vehicles have a basic function of transporting people of goods on the road and provide various additional user-convenient functions, such as audio play, video play, navigation, air conditioning control, seat control, lighting control, etc.

With the development of additional functions of smartphones and vehicles, driver's attention may be distracted due to the use of a smartphone and additional functions of the vehicle during driving of the vehicle. In particular, a driver often uses the smartphone without grasping a steering wheel, causing ever-increasing accidents.

When the driver does not grasp the steering wheel, direction control of a vehicle may not be properly performed, which might lead to serious traffic accidents.

Accordingly, when the driver does not grasp the steering wheel for more than a predetermined period of time, sounding an alarm is advised or forced by law.

SUMMARY

It is an aspect of the present disclosure to provide a steering wheel capable of recognizing whether or not a user is holding the steering wheel.

It is another aspect of the present disclosure to provide a steering wheel capable of using a rim of the steering wheel as a touch input device.

Additional aspects of the present disclosure will be set forth in part in the description which follows and, in part, will be obvious from the description, or may be learned by practice of the present disclosure.

In accordance with an exemplary embodiment of the present disclosure, a steering wheel includes: a wheel frame; a base coupled to the wheel frame to cover the wheel frame; a sensor electrode disposed on the base; and a sensor integrated circuit (IC) electrically connected to the sensor electrode and configured to sense a change in capacitance of the sensor electrode.

The base may include a metal composite, and the sensor electrode may be formed by performing a plating process or a vacuum evaporation process on an electrode groove formed by irradiating the base with a laser.

The wheel frame may include a rim, and the base may be configured to cover the rim.

The base may include a plurality of bases, and the plurality of bases may be configured to cover different regions of the rim.

The wheel frame may include a spoke, and the steering wheel may further include a printed circuit board disposed on the spoke and having the sensor IC mounted thereon.

The steering wheel may further include a connector configured to connect the sensor electrode and the printed circuit board.

The connector may include a body configured to be coupled with the base, and a connecting end configured to be connected to the printed circuit board.

The body may include a flexible printed circuit board.

The connector may include a wire provided integrally with the base, and the wire may be electrically connected to the sensor electrode.

The wire may be formed by performing a plating process or a vacuum evaporation process on an electrode groove formed by irradiating the base with a laser.

The wheel frame may include a rim having an inner side surface and an outer side surface, and the wire may be provided on the inner side surface of the rim.

The base may be configured to cover top and side surfaces of the wheel frame, and the connector may be configured to cover bottom and side surfaces of the wheel frame.

The sensor electrode may include a first sensor electrode, and a second sensor electrode provided not to overlap the first sensor electrode.

The first sensor electrode and the second sensor electrode may be formed on the same layer.

When the first sensor electrode is an Rx electrode, the second sensor electrode may be a Tx electrode, and when the first sensor electrode is a Tx electrode, the second sensor electrode may be an Rx electrode.

BRIEF DESCRIPTION OF THE DRAWINGS

These and/or other aspects of the disclosure will become apparent and more readily appreciated from the following description of embodiments, taken in conjunction with the accompanying drawings of which.

DETAILED DESCRIPTION

Figure 1:
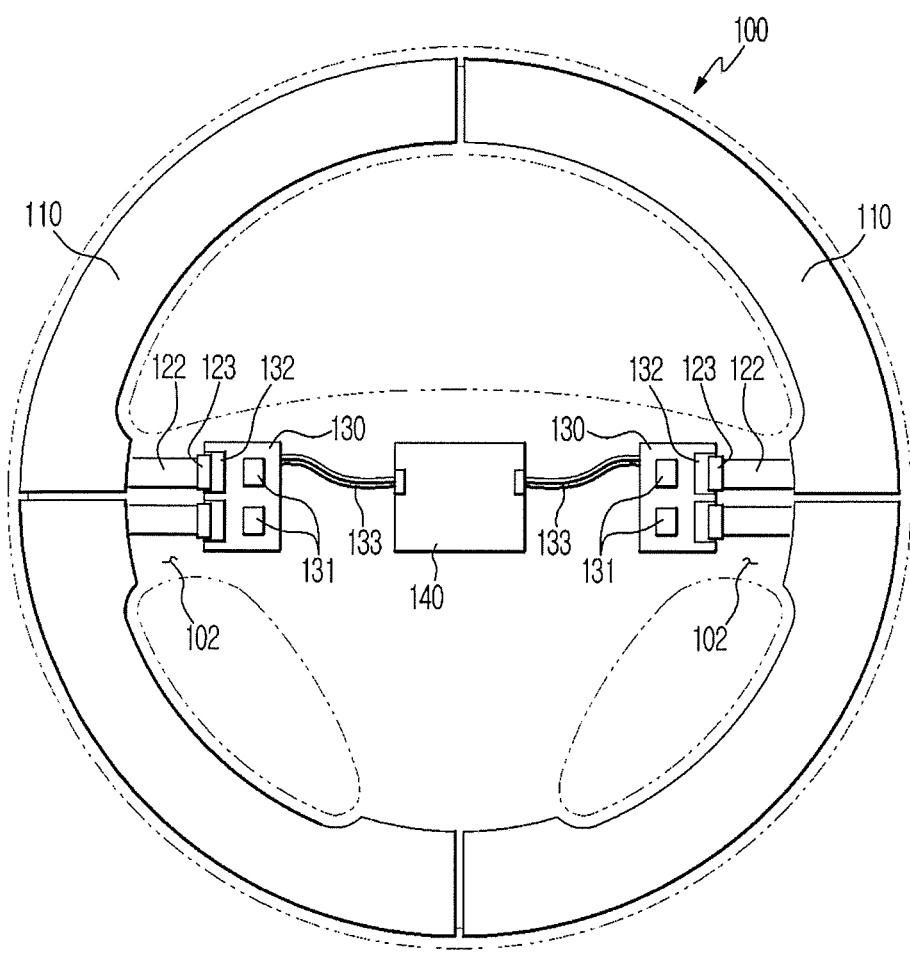
FIG. 1 is a schematic view illustrating an inside of a steering wheel according to an embodiment.

Hereinafter, embodiments of the present disclosure will be described in detail with reference to the accompanying drawings. The following embodiments are provided to deliver the technical concepts of the present disclosure to one of ordinary skilled people in the art. However, the present disclosure is not limited to the embodiments, and may be embodied in other various forms. In the drawings, parts that are irrelevant to the description of the present disclosure may not be shown for clarification, and also, for easy understanding, the sizes of components may be somewhat exaggerated.

Figure 2:
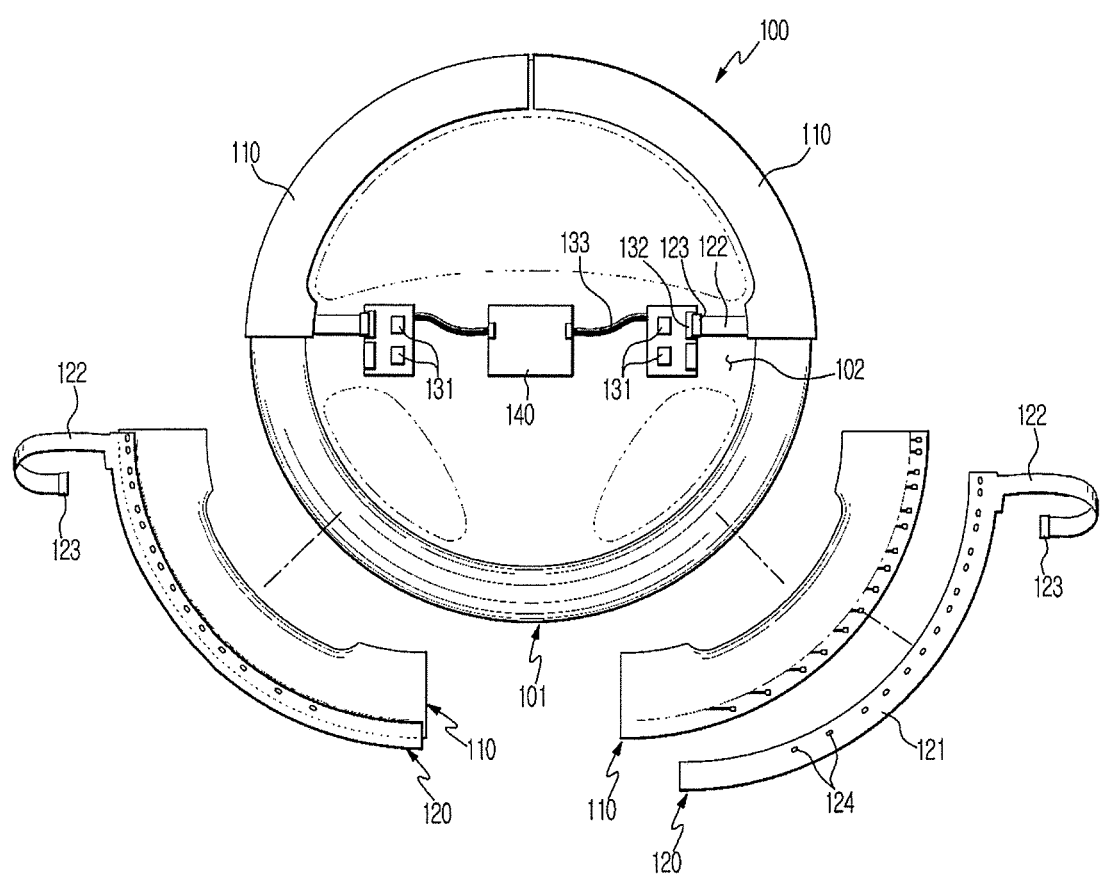
FIG. 2 is a view of the steering wheel shown in FIG. 1, in which a portion of the steering wheel is exploded.
Figure 3:
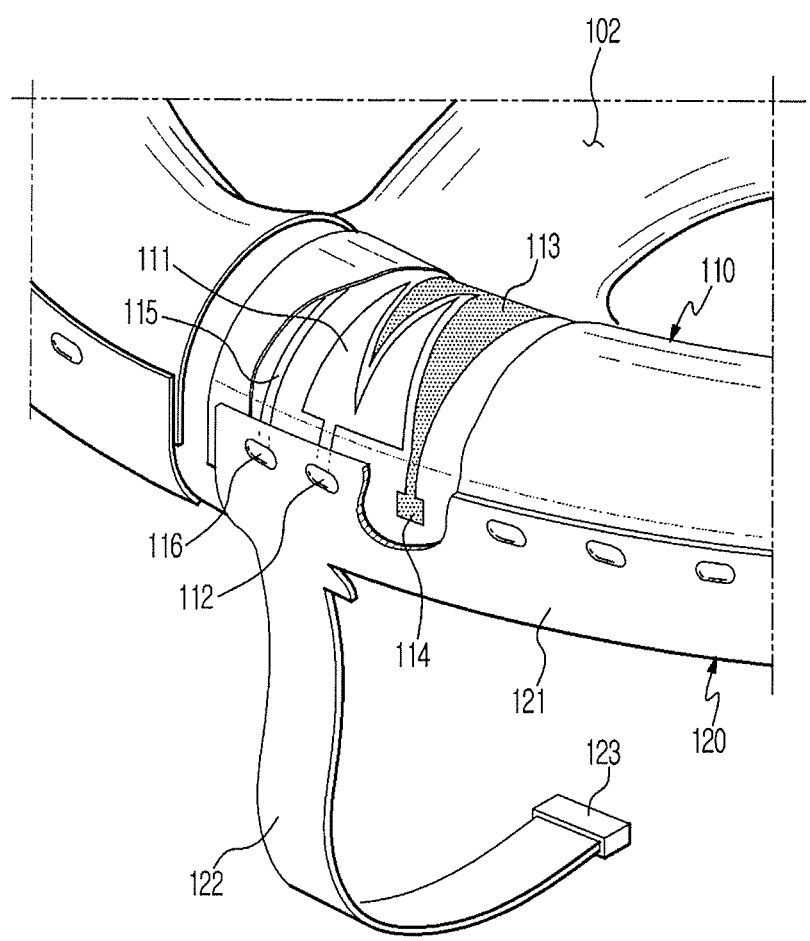
FIG. 3 is an enlarged view of a portion of a steering wheel according to an embodiment.

FIG. 1 is a schematic view illustrating an inside of a steering wheel according to an embodiment. FIG. 2 is a view of the steering wheel shown in FIG. 1, in which a portion of the steering wheel is exploded. FIG. 3 is an enlarged view of a portion of a steering wheel according to an embodiment.

As shown in FIGS. 1 and 2, a steering wheel 100 according to an embodiment may include a wheel frame 101, a base 110 configured to cover the wheel frame 101, a connector 120 coupled to the base 110, a circuit board 130 and a sensor integrated circuit (IC) 131 mounted on the printed circuit board 130.

The wheel frame 101 may include a donut-shaped rim and a spoke connecting a center axis of the steering wheel 100 and the wheel frame 101.

Although three spokes are shown in FIGS. 1 and 2, this is only an example and the number of spokes may be changed according to design specifications.

The rim may serve as a grip of the steering wheel 100. Generally, a driver may manipulate the steering wheel 100 by grasping the rim with one hand or both hands. Therefore, whether or not the steering wheel 100 is grasped may be determined from the rim gripping of the driver. As will be described later, the steering wheel 100 according to the present disclosure may be provided such that a sensor electrode covers the rim of the wheel frame 101. Accordingly, when the driver touches the rim, the steering wheel 100 may recognize it. Further, it is possible to recognize whether or not the driver is grasping the steering wheel 100 based on whether or not the rim of the driver is touched. The steering wheel 100 may recognize whether or not the driver is grasping the steering wheel 100 based on whether or not the rim is touched by the driver.

As shown in FIG. 3, the base 110 may include sensor electrodes 111 to 114. In addition, the base 110 may include a masking layer provided to cover the sensor electrodes 111 to 114. The masking layer may be provided on an outer surface of the base 110 to prevent the sensor electrodes 111 to 114 from being directly exposed and damaged by an external impact.

The base 110 may include sensor electrodes 111 to 114. The base 110 may be made of a material including a metal composite. This is to form the sensor electrodes 111 to 114 using LDS (Laser Directing Structure) process. The LDS process is to form a conductive structure on a portion of a support base, which is exposed to laser, by forming the support base with a material including a nonconductive and chemically stable metal composite, having the portion of the support base exposed to Ultra Violet (UV) laser or excimer laser to release the chemical bonding of the metal composite and expose metal seeds, and metalizing the support base.

The base 110 may include an electrode groove (not shown). The electrode groove may be formed by irradiating the base 110 with a laser. The sensor electrodes 111 to 114 may be formed in the electrode grooves through plating process or vacuum evaporation process.

The wheel frame 101 may have a curved outer surface. Specifically, the rim of the wheel frame 101 may have a curved outer surface. The base 110 may be coupled to the wheel frame 101 to cover the rim of the wheel frame 101. Since the sensor electrodes 111 to 114 are formed by the LDS process, even if the base 110 is coupled to a polygonal surface or a curved surface, the sensor electrodes 111 to 114 may operate stably.

Although not shown in the drawing, after the base 110 and the connector 120 are coupled to the wheel frame 101, a steering wheel cover (not shown) may be coupled to the wheel frame 101 to cover the wheel frame 101.

A steering wheel cover (not shown) forms an appearance of the steering wheel 100 and may be made of a nonconductive material. The steering wheel cover may be made of various materials, for example, a leather material.

As shown in FIG. 3, the base 110 may cover the top surface and part of the side surface of the rim. The top surface of the rim as herein used may be the surface facing the driver.

The base 110 may cover not only the top and side of the rim but also the bottom. However, when the driver grasps the steering wheel, it is common for the driver to touch the top and side surfaces of the steering wheel. Accordingly, the base 110 may cover the top surface and part of the side surface of the rim for cost reduction. This is because an area of the sensor electrodes 111 to 114 formed on the base 110 may be reduced.

The connector 120 may be coupled to the base 110. The connector 120 may be a flexible printed circuit board (FPCB). The connector 120 may be coupled to the base 110 by soldering. Although not shown in the drawing, the connector 120 may include a wire (not shown) provided to electrically connect the sensor electrodes 111 to 114 formed on the base 110 and the sensor IC 131 mounted on the printed circuit board 130.

The connector 120 may include a body 121 coupled to the base 110, an extension portion 122 extending from a side of the body 121, and a connecting end 123 provided at one end of the extension portion 122 and connected to the printed circuit board 130

The body 121 may include a plurality of contact portions 124. The contact portion 124 may be connected and coupled to end portions 112 and 114 of the sensor electrode, which will be described later, by soldering. The wire of the connector 120 and the sensor electrode of the base 110 may be electrically connected by connecting the contact portion 124 and the end portions 112 and 114 of the sensor electrode by soldering.

The extension portion 122 may be connected to the printed circuit board 130 through side and bottom surfaces of the wheel frame 101. The extension portion 122 may extend from the body 121 to connect the body 121 and the printed circuit board 130. The extension portion 122 is not limited in location but may be disposed on a side of the body 121 close to the spoke 102 such that a distance from the printed circuit board 130 disposed on the spoke 102 is reduced.

The connector 120 may include a connecting end 123 provided at one end of the extension portion 122. The connecting end 123 may be connected to a substrate connection part 132 provided on the printed circuit board 130. When the connecting end 123 is connected to the substrate connection part 132, the base 110 and the printed circuit board 130 may be electrically connected by the connector 120. In this embodiment, the connecting end 123 may be provided to be detachable from the substrate connection part 132. However, the present disclosure is not limited to this, and the extension portion 122 may be connected directly to the printed circuit board 130 by soldering or the like without a separate connecting end and a substrate connection part.

The printed circuit board 130 may include a sensor IC 131 and a substrate connection part 132. The sensor IC 131 may be electrically connected to the sensor electrodes 111 to 114 to sense a change in capacitance of the sensor electrode. The sensor IC 131 may recognize whether or not the driver approaches or touches the sensor electrodes 111 to 114.

The substrate connection part 132 may be provided so as to be connected to the connecting end 123 as described above. The substrate connection part 132 may be connected to the sensor IC 131. The sensor electrodes 111 to 114 are electrically connected to the substrate connection part 132 through the wire of the connector 120 and the connecting end 123, and the substrate connection part 132 is electrically connected to the sensor IC 131. Accordingly, the sensor electrodes 111 to 114 may be electrically connected to the sensor IC 131.

Although not shown in the drawings, the connector may be integrally provided with the base 110. At this time, the wire (not shown) may be formed by the LDS process like the sensor electrodes 111 to 114. According to this, a separate soldering process for connecting the connector and the base may be omitted. The wire may be protected from an external impact by including a masking layer (not shown) on an upper portion of the wire like the sensor electrodes 111 to 114.

As described above, the rim may be provided in a substantially donut shape. The rim may have an inner side surface and an outer side surface. The inner side surface refers to a side surface of the rim connected to the spoke.

The wire may be provided on the inner side surface of the rim. When the driver grasps the steering wheel 100, the driver's finger or the like does not generally touch the inner side surface of the rim. Therefore, the inner side surface of the rim is not typically affected by the driver's body. In addition, since the inner side surface of the rim is not exposed to the driver's body, the necessity of providing the sensor electrode is relatively low. Because of this feature, the wire may be provided on the inner side surface of the rim. If the wire is damaged, the electrical connection between the sensor electrode and the sensor IC may be cut off, hindering normal operation of the sensor electrode. When the wire is provided on the inner side surface of the rim, the body of the driver does not generally touch the inner side surface of the rim, so that a possibility of the wire being damaged by the driver's body is low. Furthermore, since the body of the driver does not generally reach the region, there is little need to provide therein a sensor electrode for sensing the driver's touch, and with wire disposed in the region, the sensor electrode may be widely arranged in another region.

According to an embodiment, the base 110 and the connector 120 may be provided in plural. For example, as shown in FIGS. 1 and 2, the base 110 and the connector 120 may be provided in four. A plurality of sensor ICs 131 may be provided to correspond to the number of the base 110 and the connector 120, and four sensor ICs 131 may be provided as shown in the drawings. Since the printed circuit board 130 may include a plurality of sensor ICs 131, the printed circuit board 130 may be provided in a smaller number than the sensor ICs 131. For example, as shown in the drawings, the printed circuit board 130 may be provided in two.

The steering wheel 100 may include a controller 140 configured to control the plurality of sensor ICs 131. The controller 140 may be provided as a separate printed circuit board. At this time, the controller 140 and the printed circuit board 130 may be connected to each other by a flexible printed circuit board 133. Alternatively, the controller 140 may be provided on the printed circuit board 130 together with the sensor IC 131. As shown in the drawings, the controller 140 may be disposed at the center of the steering wheel 100, but is not limited thereto. The controller 140 may be disposed inside the vehicle.

Figure 4:
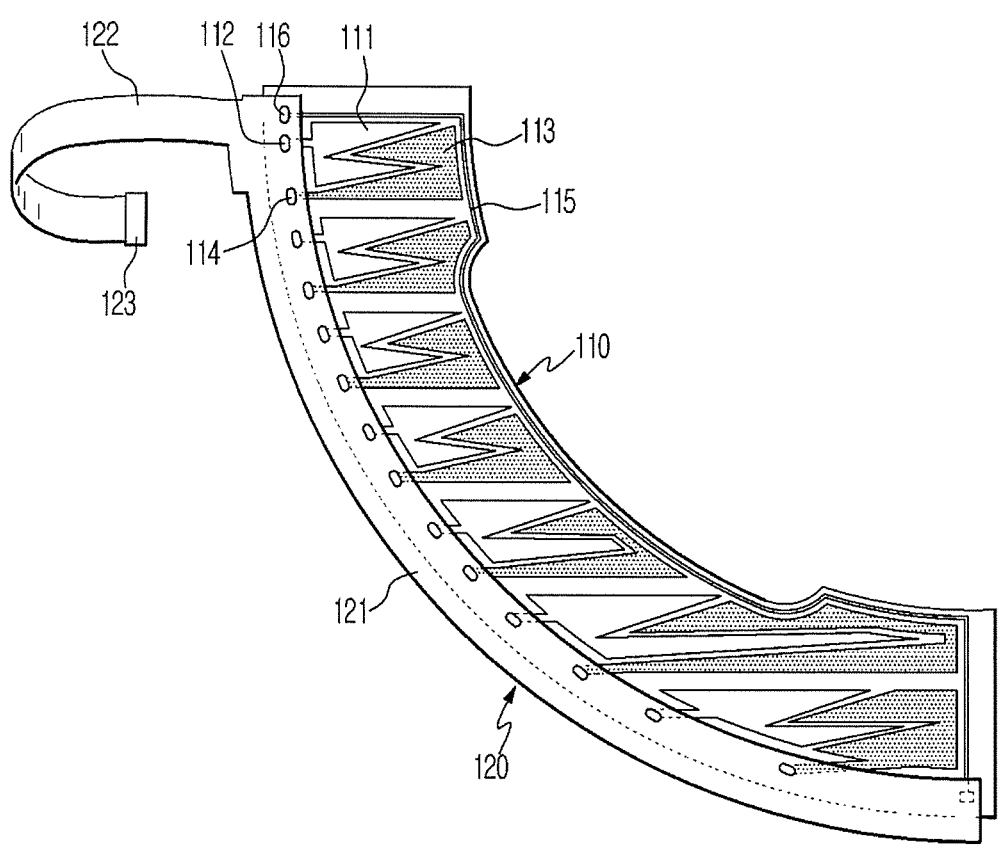
FIG. 4 is a view illustrating a base and a connector in a steering wheel according to an embodiment.

FIG. 4 is a view illustrating a base and a connector in a steering wheel according to an embodiment.

As shown in FIG. 4, the base 110 may include sensor electrodes 111 to 114. The base 110 may include ground electrodes 115 and 116 that are provided to correct a sensing area of the sensor electrodes 111 to 114.

As described above, the base 110 may be made of a material including a metal composite. The sensor electrodes 111 to 114 may be formed by exposing the base 110 to laser to break the chemical bonding of the metal composite and expose metal seeds and then metalizing the exposed metal seeds.

The sensor electrodes 111 to 114 may have a predetermined pattern. The sensor electrodes 111 to 114 may include first sensor electrodes 111 and 112 and second sensor electrodes 113 and 114.

The first sensor electrodes 111 and 112 and the second sensor electrodes 113 and 114 may be arranged not to overlap each other. The first sensor electrodes 111 and 112 and the second sensor electrodes 113 and 114 may be formed on the same layer. The first sensor electrodes 111 and 112 and the second sensor electrodes 113 and 114 may include a protruding region and a recessed region in order to improve the sensing capabilities relative to the number of the sensor electrodes 111 to 114. As shown in FIG. 4, the protruding region and the recessed region may be provided in a substantially triangular shape.

The first sensor electrodes 111 and 112 and the second sensor electrodes 113 and 114 may be provided in a self-capacitance type. In the case of the self-capacitance type, the first sensor electrodes 111 and 112 and the second sensor electrodes 113 and 114 are independent sensors, respectively. Each sensor electrode measures a capacitance value between a surface of the sensor electrode and a body part such as the driver's finger, and the capacitance value measured increases as the driver and the sensor electrode approach each other.

The first sensor electrodes 111 and 112 and the second sensor electrodes 113 and 114 may be provided in a mutual capacitance type. In this case, the first sensor electrodes 111 and 112 may be Tx electrodes or Rx electrodes, and the second sensor electrodes 113 and 114 may be Rx electrodes or Tx electrodes. In the case of the mutual capacitance type, a capacitance value formed between the first sensor electrodes 111 and 112 and the second sensor electrodes 113 and 114 is measured, and the measured capacitance value decreases as the driver and the sensor electrode approach each other.

An end 112 of the first sensor electrode and an end 114 of the second sensor electrode may be coupled to the contact portion 124 of the connector 120 by soldering.

The ground electrodes 115 and 116 may be formed around the sensor electrodes 111 to 114. Accordingly, the sensing area of the sensor electrodes 111 to 114 may be corrected to a vertical direction of the sensor electrodes 111 to 114, and the frequency of occurrence of noise may be reduced.

An end portion 116 of the ground electrode may be connected to the contact portion 124 of the connector 120 by soldering as in the case of the end portions 112 and 114 of the sensor electrode.

Figure 5:
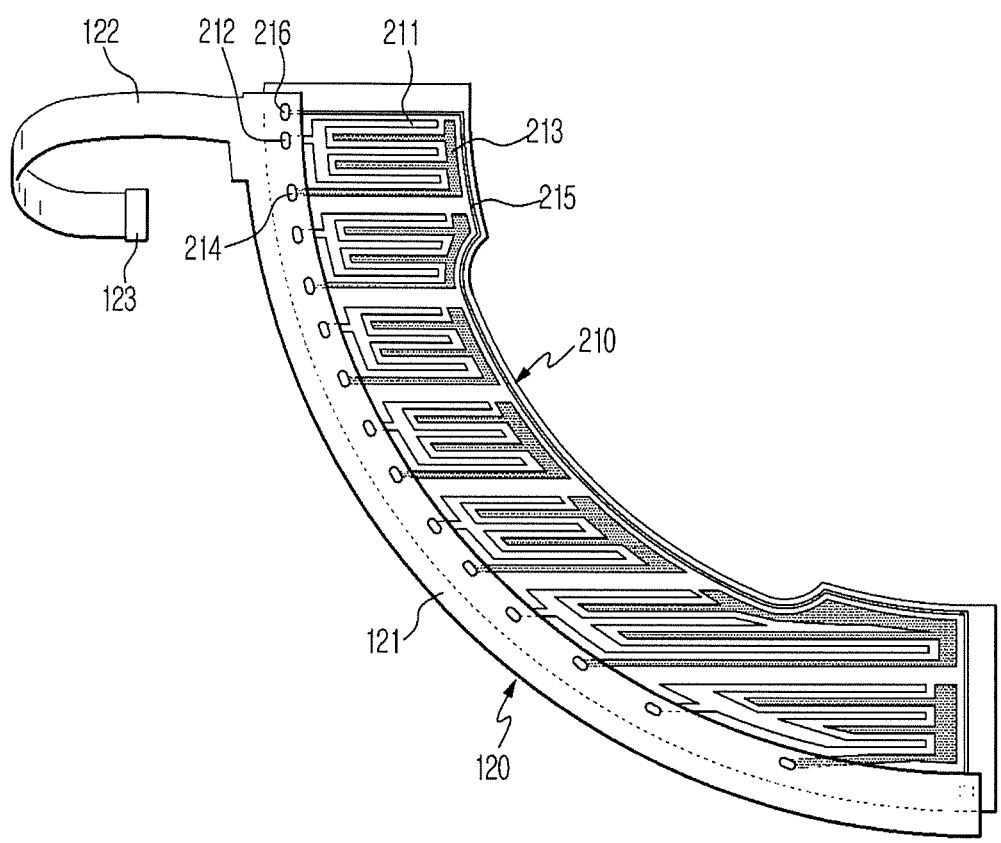
FIG. 5 is a view illustrating a base and a connector in a steering wheel according to another embodiment.

FIG. 5 is a view illustrating a base and a connector in a steering wheel according to another embodiment.

As shown in FIG. 5, a base 210 may include sensor electrodes 211 to 214 and ground electrodes 215 and 216.

Except for the shapes of the sensor electrodes 211 to 214, the remaining components are the same as those of the above-described embodiment, so duplicate descriptions will be omitted.

As shown in FIG. 5, the first sensor electrodes 211 and 212 and the second sensor electrodes 213 and 214 may have a predetermined pattern. The first sensor electrodes 211 and 212 and the second sensor electrodes 213 and 214 may be arranged not to overlap with each other.

The sensor electrodes 211 to 214 may be formed by metalizing metal seeds exposed by laser irradiation onto the base 210 including the metal composite.

The first sensor electrodes 211 and 212 and the second sensor electrodes 213 and 214 may each have a protruding region and a recessed region and the protruding region and the recessed region may have a substantially rectangular shape.

An end portions 212 of the first sensor electrode and an end portions 214 of the second sensor electrode may be coupled to the contact portion 124 of the connector 120 by soldering.

The ground electrodes 215 and 216 may be formed around the sensor electrodes 211 to 214. Accordingly, a sensing area of the sensor electrodes 211 to 214 may be corrected to the vertical direction of the sensor electrodes 211 to 214, and the frequency of occurrence of noise may be reduced.

An end portion 216 of the ground electrode may be connected to the contact portion 124 of the connector 120 by soldering as in the case of the end portions 212 and 214 of the sensor electrode.

According to embodiments of the present disclosure, a steering wheel capable of recognizing whether or not a user is holding the steering wheel may be provided.

According to embodiments of the present disclosure, a steering wheel capable of using a rim of the steering wheel as a touch input device may be provided.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A steering wheel comprising:
   a wheel frame;
   a base coupled to the wheel frame to cover the wheel frame;
   a sensor electrode disposed on the base; and
   a sensor integrated circuit (IC) electrically connected to the sensor electrode and configured to sense a change in capacitance of the sensor electrode,
   wherein the base includes a metal composite, and
   wherein the sensor electrode is a plating processed sensor electrode or a vacuum evaporation processed sensor electrode disposed on an electrode groove which is grooved by irradiating the base with a laser.

2. The steering wheel of claim 1, wherein the wheel frame includes a rim which is covered by the base.

3. The steering wheel of claim 2, wherein the base includes a plurality of bases, and
   the plurality of bases cover different regions of the rim.

4. The steering wheel of claim 1, wherein the wheel frame includes a spoke, and
   the steering wheel further comprises a printed circuit board disposed on the spoke and having the sensor IC mounted thereon.

5. The steering wheel of claim 4 further comprising a connector configured to connect the sensor electrode and the printed circuit board.

6. The steering wheel of claim 5, wherein the connector includes a body coupled with the base, and
   a connecting end connected to the printed circuit board.

7. The steering wheel of claim 6, wherein the body includes a flexible printed circuit board.

8. The steering wheel of claim 5, wherein the connector includes a wire integrally combined with the base, and
   the wire is electrically connected to the sensor electrode.

9. The steering wheel of claim 8, wherein the wire is a plating processed wire or a vacuum evaporation processed wire disposed on electrode groove which is grooved by irradiating the base with the laser.

10. The steering wheel of claim 9, wherein
    the wheel frame includes a rim having an inner side surface and an outer side surface, and
    the wire is provided on the inner side surface of the rim.

11. The steering wheel of claim 5, wherein the base covers top and side surfaces of the wheel frame, and
    the connector covers bottom and side surfaces of the wheel frame.

12. The steering wheel of claim 1, wherein the sensor electrode includes a first sensor electrode, and
    a second sensor electrode which is spaced apart from the first sensor electrode.

13. The steering wheel of claim 12, wherein the first sensor electrode and the second sensor electrode are disposed on the same layer.

14. The steering wheel of claim 12, wherein when the first sensor electrode is an Rx electrode, the second sensor electrode is a Tx electrode, and
    when the first sensor electrode is a Tx electrode, the second sensor electrode is an Rx electrode.

* * * * *